United States Patent
Godfrey et al.

[19]

[11] Patent Number: 6,064,218
[45] Date of Patent: May 16, 2000

[54] PERIPHERALLY LEADED PACKAGE TEST CONTACTOR

[75] Inventors: Mark K. Godfrey, Oakdale; Jesse G. Crane, South St. Paul; Paul Zadworniak, White Bear Lake; Daniel C Marinac, Eagan, all of Minn.

[73] Assignee: PrimeYield Systems, Inc., St. Paul, Minn.

[21] Appl. No.: 08/815,191

[22] Filed: Mar. 11, 1997

[51] Int. Cl.[7] .................................................. G01R 1/073
[52] U.S. Cl. ........................... 324/762; 324/755; 324/758
[58] Field of Search .................................... 324/754, 755, 324/756, 757, 758, 762

[56] References Cited

U.S. PATENT DOCUMENTS

| | | | |
|---|---|---|---|
| 3,702,439 | 11/1972 | McGahey et al. | 324/158 |
| 4,068,170 | 1/1978 | Chayka et al. | 324/762 X |
| 4,419,626 | 12/1983 | Cedrone et al. | 324/158 |
| 4,574,235 | 3/1986 | Kelly et al. | 324/158 F |
| 4,686,468 | 8/1987 | Lee et al. | 324/158 F |
| 4,747,784 | 5/1988 | Cedrone | 324/762 X |
| 4,835,464 | 5/1989 | Slye et al. | 324/158 F |
| 5,057,904 | 10/1991 | Nagato et al. | 357/74 |
| 5,127,837 | 7/1992 | Shah et al. | 439/71 |
| 5,136,586 | 8/1992 | Greenblatt | 370/110.4 |
| 5,156,649 | 10/1992 | Compton et al. | 439/68 |
| 5,171,290 | 12/1992 | Olla et al. | 439/71 |
| 5,254,834 | 10/1993 | Johnson | 219/121.72 |
| 5,277,594 | 1/1994 | Matsuoka et al. | 439/172 |
| 5,307,012 | 4/1994 | Bhattacharyya et al. | 324/158 |
| 5,336,094 | 8/1994 | Johnson | 439/62 |
| 5,360,348 | 11/1994 | Johnson | 439/72 |
| 5,452,289 | 9/1995 | Sharma et al. | 370/32.1 |
| 5,479,110 | 12/1995 | Crane et al. | 324/757 |
| 5,500,605 | 3/1996 | Chang | 324/758 |
| 5,557,212 | 9/1996 | Isaac et al. | 324/755 |
| 5,742,171 | 4/1998 | Matsunaga et al. | 324/755 |

FOREIGN PATENT DOCUMENTS

| | | |
|---|---|---|
| 0420690 | 4/1991 | European Pat. Off. . |
| 0582537 | 2/1994 | European Pat. Off. ........ H04L 29/06 |
| 19515154 | 3/1996 | Germany . |
| 2274212 | 7/1994 | United Kingdom . |

OTHER PUBLICATIONS

"Manual Test Probing of Very Small Targets on the Top and Bottom of a Module Simultaneously", Research Disclosure, 2244 No. 329, Emsworth, GB, p. 656 (Sep. 1991).

Bove, R., "High Performance contactor", *IBM Technical Disclosure Bulleitn*, vol.18, No. 9, p. 2883 (Feb. 1976).

Byrnes, H.P., et al., "Pad Deformation Contactor", *IBM Technical Disclosure Bulletin*, vol. 21, No. 11, pp. 4511–4512 (Apr. 1979).

(List continued on next page.)

*Primary Examiner*—Glenn W. Brown
*Attorney, Agent, or Firm*—Schwegman, Lundberg, Woessner & Kluth, P.A.

[57] ABSTRACT

A contactor receives an electrical component having peripheral leads. The contactor guides the peripherally leaded component into contact with automated testing equipment. Electrical connections are made with the peripheral leads of the electrical component. The contactor includes a number of cantilever spring contacts for contacting the peripheral leads on the component in the peripherally leaded package. Each cantilever spring contact has a first free end which is upturned and contacts the peripheral lead. The cantilever spring contact has a second attached end. The attached end is positioned over and in electrical contact with an anisotropic, conductive interposer which conducts electrical current in two directions along an axis through the interposer. The contactor includes an alignment mechanism for aligning the peripheral leads of the component to corresponding cantilevered spring contacts of the contactor. An interface board also contacts the anisotropic, conductive interposer. The interface board has a plurality of electrical pads. The anisotropic, conductive interposer provides a portion of the electrical path to the pads on the interface board when the cantilevered spring contacts contact the peripheral leads of the electrical component. The interface board is connected to the test electronics.

16 Claims, 10 Drawing Sheets

OTHER PUBLICATIONS

Johnson, D.A., et al., "Test Socket Performance Handbook", Published by Johnstech International Corporation, Cover page, Title page, pp. 1–37, 4 pages unnumbered (Oct. 1993).

Johnson, D.A., et al., *Test Socket Performance Handbook, 1st Edition*, Jonstech International, pp. 5–36, (1993) (month unavailable).

Shinetsu, Product Sheet for Interposed Material, pp. 1–19 (date unavailable).

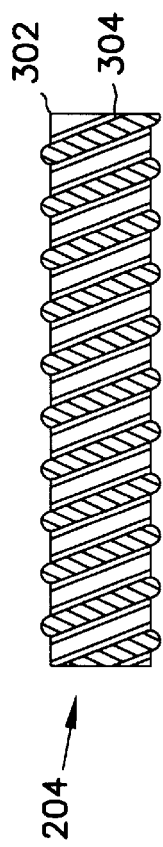
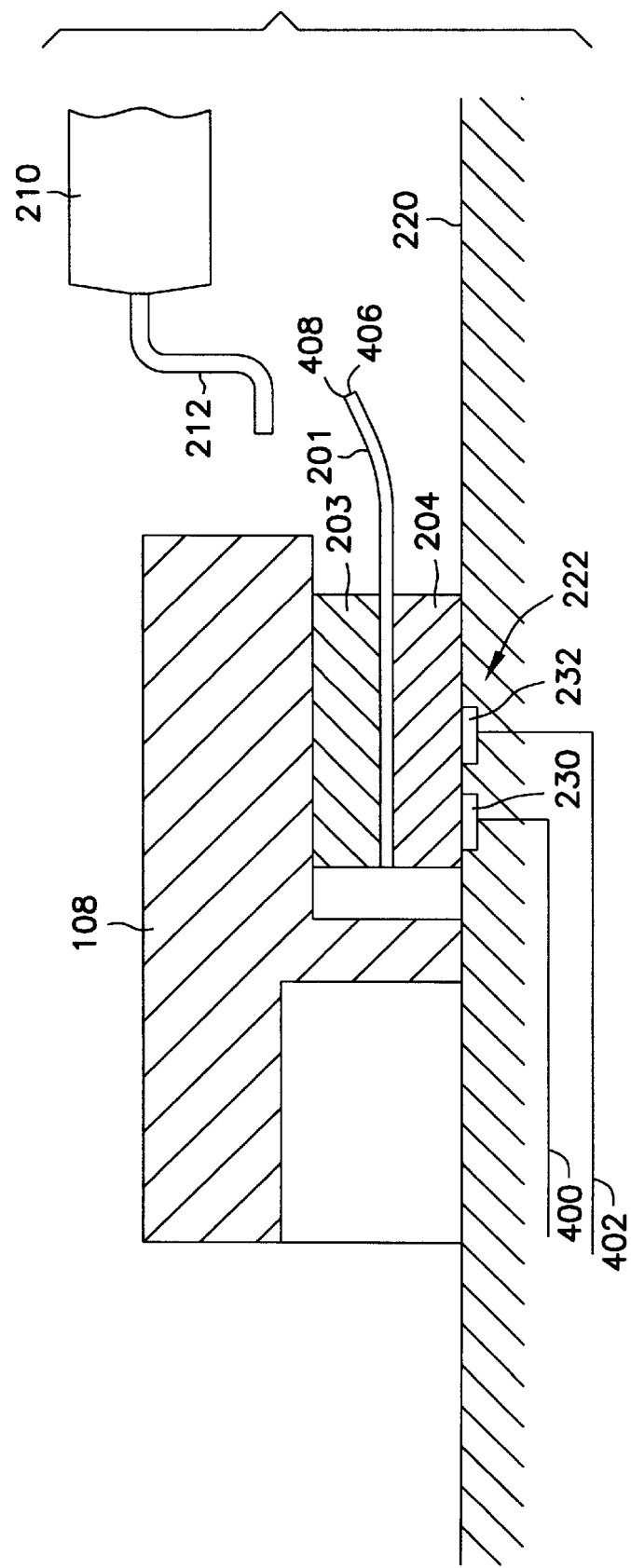
FIG. 3
FIG. 4

PERIPHERALLY LEADED PACKAGE TEST CONTACTOR

FIELD OF THE INVENTION

The present invention relates to a method and apparatus for providing electrical contacts and more specifically to making electrical contacts between a test apparatus and an electrical component in a peripherally leaded package.

BACKGROUND OF THE INVENTION

In the past, contactors have been used to electrically connect the individual leads of a peripherally leaded semiconductor package with a test apparatus to electrically test the component. Peripherally leaded semiconductor packages had leads joining the package body around the outside edge of the package. Peripherally leaded packages include the following types of electronic packages: quad-flat pack family, small outline family, plastic leaded chip carrier family, dual in-line family, molded carrier rings and others. Peripherally leaded packages come in various dimensions and the leads may be positioned around all four sides of the package or around less than all four sides.

In the past, several apparatuses have been used to make electrical testing connections to peripherally leaded packages and other semiconductor packages. Previous test contactors have had severe limitations for high performance devices and for reliable operation when used with high volume, automated device handling equipment. Many of the problems result in poor electrical performance. Typically, this is due to long electrical path lengths within the contactor. Long electrical path lengths exhibit undesirable impedance effects which interfere with the integrity of the electrical tests being performed on the device under test. Undesirable impedance effects include long paths of uncontrolled impedance. Such uncontrolled impedance paths distort high frequency signal integrity and allow crosstalk between physically adjacent paths. Other undesirable impedance effects include parasitic inductance, capacitance, and resistance. Parasitic path inductance interferes with device power and ground sourcing by inducing voltage spikes during instantaneous electrical current changes. Parasitic capacitance presents undesirable electrical loading of device and test electronics signal sources. Parasitic resistance causes voltage errors when significant current must flow through the resistive path. This is only a partial list of undesirable impedance effects which occur with long electrical paths in test contactors.

Previous test contactors often performed poorly in high volume test environments which employ automated device handling equipment. Contactor fragility often results in contactor damage when a handling equipment error presents a device to a contactor incorrectly. Contactors often wear rapidly during high volume use resulting in wear damage to alignment features and contact surfaces. Contactors may also be too susceptible to contamination from normal production environment debris such as package resin dust and package lead solder-plating.

Some contactors control the undesirable impedance effects by including a transmission line between the contact and the production test cell. Including a transmission line controls the impedance of the line, but introduces a different problem. This problem is that the electrical test apparatus, including the interface board between the contactor and the electrical test apparatus, is more remote from the device under test. U.S. Pat. No. 4,574,235, issued to Kelley et al. and assigned to Micro Component Technology shows such a contactor. Several test applications require external circuitry, such as tuning capacitors or signal buffers, in very close proximity to the device. These circuit elements are typically connected on the tester interface board where they can be very close to the contactor and are easily configured in the desired circuit. Such applications do not tolerate a contactor that presents significant electrical path length between the device and the external circuitry even if the path impedance is controlled.

JohnsTech International has a product called Short Contact which is a contactor having short leads. The short leads are actually small S-shaped hooks that ride on two round bands of elastic. One hook end of the S-shaped hook engages an elastic band located close to an interface board. The other hook end of the S-shaped hook engages an elastic band close to where peripherally leaded contacts the S-shaped hook. The other end of the S-shaped hook includes a tapered head for contacting the peripheral lead. A plurality of S-shared hooks engage the same round band of elastic in the same way. U.S. Pat. No. 5,360,348 issued to David A. Johnson and assigned to JohnsTech International Corporation shows the S-shaped hook as element number 24 and the elastic bands as element 28.

This product addresses many of the electrical problems which produce undesirable impedance effects and are associated with contactors that have long leads. The Johnstech product, however, has several shortcomings. The S-shaped hooks are not fully independent of one another since a plurality of hooks engage the same elastic support. This lack of independence limits coplanarity compliance of the S-shaped hooks. In addition, the elastic band's characteristics change with changes in temperature. When the temperature gets colder, the elastic band becomes harder and less compliant. The result is that the Johnstech International Short Contact product is prone to reduced life when used at lower temperatures.

Another problem is the complexity associated with manufacturing the product and the amount of complexity associated with replacing elements of the Johnstech International contactor when the contactor wears out. Contacts within a contactor wear out. When the contacts of the Johnstech product wear out, it takes workers a long time to replace the contacts within the contactor. Each individual little S-shaped hook has to be removed from the pair of elastomer supports and then a new S-shaped hook contact has to be engaged with the same two elastomer supports. There are many individual S-shaped contacts so it is not uncommon for the rebuilding of a contactor to take several hours. This does not seem significant until one realizes that a contactor is incorporated into a semiconductor production line and this line will be shut down while the contactor is being rebuilt. Thus, downtime due to rebuilding the contactor not only takes a production line with 2–4 million dollars worth of machinery out of use, but also results in lost production and lost revenue to the manufacturer using the Johnstech International Short Contact contactor.

The alternative to shutting down a production line is to carry spares in inventory. Spare parts translate into increased inventory with an increased cost for maintenance.

There is a real need for a contactor that is quick and simple to rebuild and replace so down time on manufacturing lines is minimized. There is also an overwhelming need for a contactor that does not have the electrical performance problems of undesirable impedance effects. There is also need for a contactor having individual contacts that work independently to provide optimum coplanarity compliance.

There is also a need for a contactor where the physical performance of the contacts is not dependent on temperature. There is also a need for a contactor with a life span independent of the temperature of operation.

SUMMARY OF THE INVENTION

The test contactor aligns the contacts with the leads of the peripherally leaded semiconductor package under test. The contacts of the test contactor contact the peripheral leads of the device under test. The contacts of the contactor also contact the automated test equipment to make a path between the automated test equipment and the leads of the device under test. The contactor includes a number of cantilever spring contacts for contacting the peripheral leads on the component in the peripherally leaded package. Each cantilever spring contact has a first free end which is upturned and contacts a device lead. The cantilever spring contact has a second attached end. The attached end is positioned adjacent an anisotropic, compliant, conductive interposer which conducts electrical current in two directions along an axis through the interposer. The contactor includes an alignment mechanism to align the peripheral leads of the component to corresponding cantilevered spring contacts of the contactor. An electrical path is formed including the cantilevered spring contact, the lead and a portion of the anisotropic, compliant, conductive interposer. The interface board has a plurality of electrical contact pads which correspond to each cantilever spring contact. The anisotropic, compliant, conductive interposer provides a portion of the electrical path to the pads on the interface board. One end of the cantilevered spring contacts is always in contact with the interposer. The interface board is connected to the electrical test apparatus.

Advantageously, the contacts are very short in length when compared to most other contactors for peripherally leaded components. Since the contact elements are short, very little undesirable impedance effects are encountered by signals passing through the short contact. A short contact element introduces little capacitance or inductance.

Each individual contact is a cantilever spring contact which can be deflected with very small force. The force needed to deflect the contact element is small enough so that the fragile peripheral leads and associated plating thereon of a device are not damaged. Damage to the peripheral leads generally ruins the component. The use of the cantilever spring contact element also accommodates nonplanarity in the components under test. This is also described in the industry in terms of compliance. Chip devices or electrical components are not planar or perfectly flat. Thus, a contactor must accommodate the non-planarity of the device and the leads attached to it. Each of the contact elements in the contactor acts independently of the other contact elements used when making the electrical connection to the peripheral lead. The result is that cantilevered spring-type contacts allow maximum compliance to accommodate device non-coplanarities with minimal force onto the peripheral leads of the chip device or component under test. In addition, the contactor makes reliable electrical connections through a wide range of temperature. The contacts are each merely a cantilevered spring contact of spring metal which are relatively unaffected by changes in temperature.

These contactors are typically a portion of an automated tester used to test components on an automated production cell. The cantilevered spring contacts are each attached to a stiffener which is a rectangular length of nonconducting material. This construction provides for a single element having many cantilevered spring contact elements that can be replaced quickly and simply. This is a significant advantage when considering that when the contactor wears out, the automated production cell lies idle until replacement of the wear elements of the contactor is complete. The wear elements are replaced in a matter of minutes compared to a number of hours required to replace the contacts in other contact devices.

BRIEF DESCRIPTION OF THE DRAWINGS

FIG. 3 is a cross section view of the anisotropic, compliant, conductive interposer.

FIG. 4 is a cross-section view of a contactor and a test electronics interface board.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
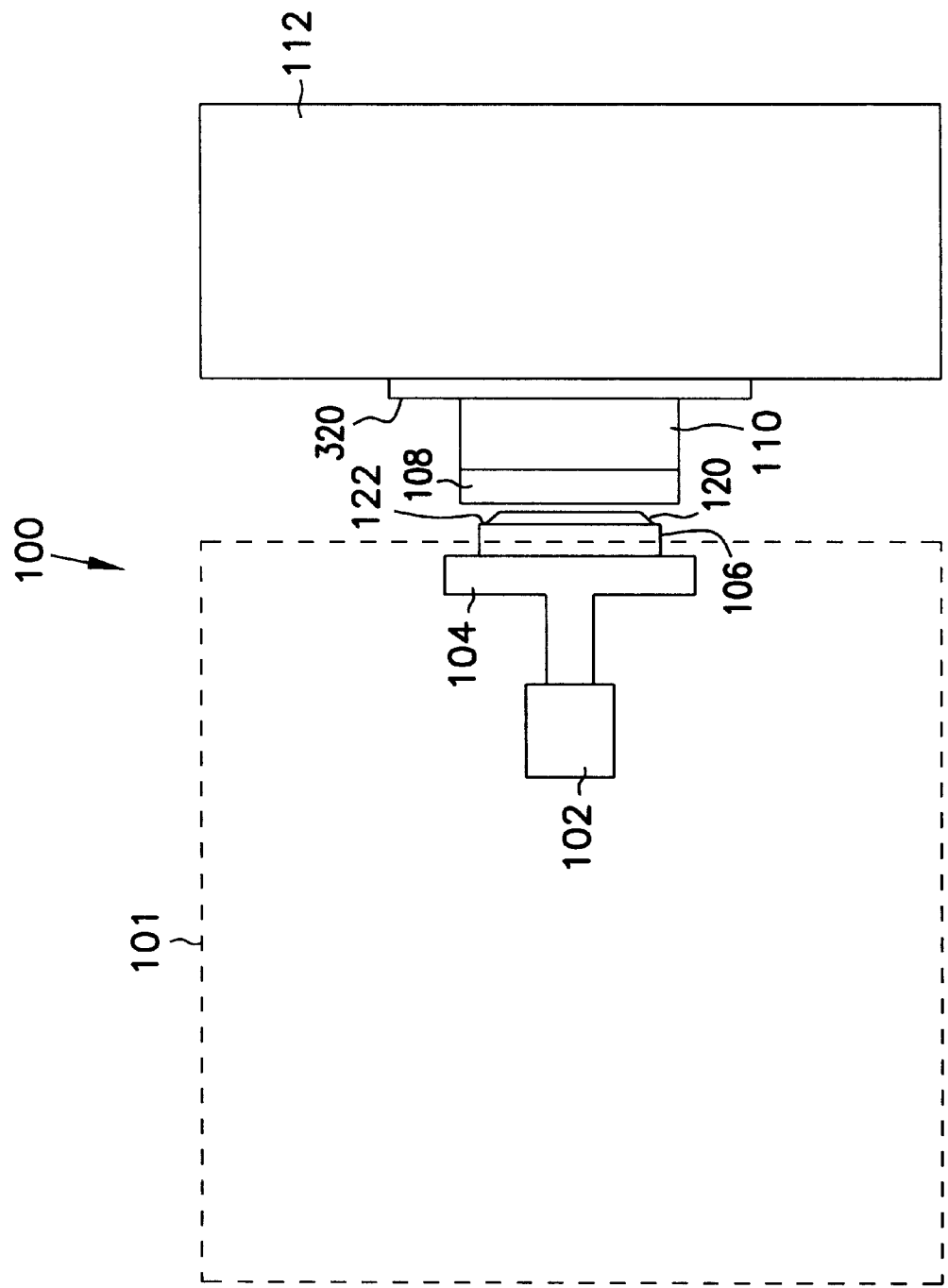
FIG. 1 is a schematic diagram of an electrical testing apparatus.

FIG. 1 is a schematic diagram of the testing apparatus. The testing apparatus 100 includes an automated test handler 101. The automated test handler includes an actuator 102, a plunger 104, and a nest 106. The testing apparatus includes a contactor 110 having a guide plate 108, an interface board 320 and automatic test equipment or test electronics 112. The nest 106 holds an electrical component under test. The electrical component is not shown in FIG. 1. The plunger 104 typically holds the electrical component within the nest 106 via vacuum pickup. The nest may include beveled surfaces, such as bevel 120, which is used to coarsely align the nest with the guide plate 108. The nest also includes some hard stops 122 which abut the edge of the guide plate and limit the travel of nest 106 into the guide plate 108 of the contactor 110. When the nest 106 is holding the electrical component to be tested, the plunger is moved by actuator 102 so that the electrical component is moved toward the guide plate 108. The guide plate provides both coarse alignment as well as fine alignment as the nest 106 enters the guide plate 108. The contactor 110 includes cantilevered spring contacts which are part of the electrical paths to the electronics 112 for testing the electrical component. The electronics for testing the component are also called automatic test equipment.

Figure 2:
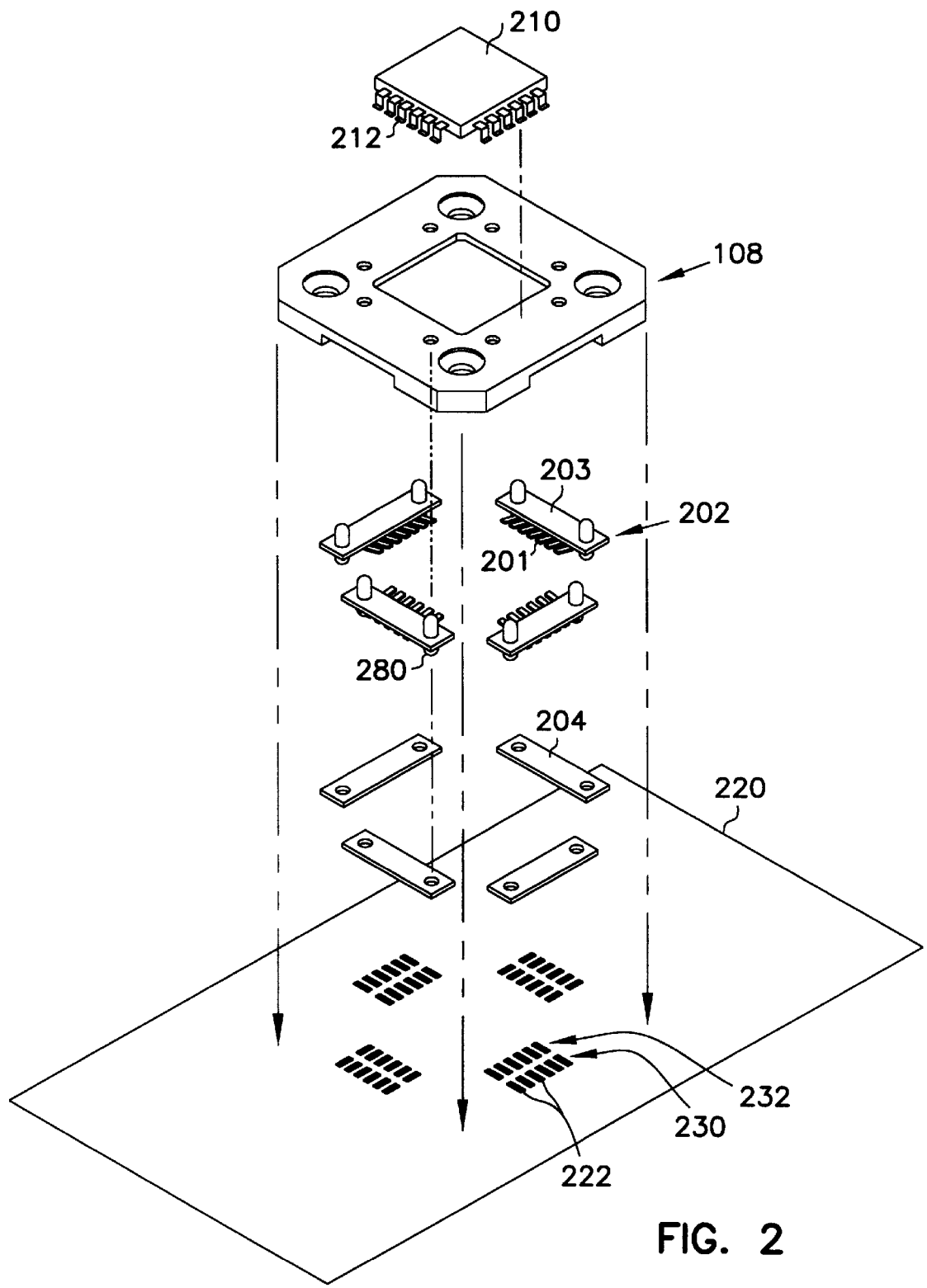
FIG. 2 is an exploded isometric drawing of a contactor and a test electronics interface board.

FIG. 2 shows an exploded isometric drawing of a contactor and interface board. The contactor 110 includes the guide plate 108, the lead frame 202 with its cantilevered spring contacts 201 held together with a stiffener 203, and an anisotropic, compliant, conductive interposer 204. Also shown in FIG. 2 is the chip device or electrical component 210 that is to be tested. The device or electrical component is a peripherally leaded semiconductor package. The device 210 has interconnect 212 leads joining the package body around the outside edge of the package. There are a plurality of peripheral leads 212 shown on the device 210. Peripherally leaded packages include the following types of electronic packages: quad-flat pack family, small outline family, plastic leaded chip carrier family, dual in-line family, molded carrier rings, and others. The device 210 is a typical example of one of these types of packages. It should be noted that the devices come in various dimensions and that the peripheral leads may be on all four sides or less than all four sides of the package.

The lead frame 202 includes a number of spring metal contacts 201 and a lead frame stiffener 203. The lead frame stiffener 203 is made of a nonconductive phenolic material commonly used in printed circuit board manufacturing such as FR4, which is readily available in flat-panel form with a well-controlled thickness. The stiffener 203 is bonded to a number of spring metal contacts and holds them in position from one another. It is not necessary to make the lead frame stiffener from this particular material as any rigid stiffener meeting the requirements for strength, temperature characteristics and the ability to be bonded to the leads will suffice.

The lead frame 202 is made by photo etching a pattern of rectangular openings into a sheet of conductive spring metal. Of course, the openings in the sheet may not always be rectangular, such as when the contact leads are designed to be tapered. Also etched are a pair of registration or alignment openings. After completion of the etching operation, a stiffener 203 is attached to the spring contact elements 201. The ends of the sheet are trimmed to form the contact elements 201. The trimming operation is tailored to produce upturned ends.

FIG. 2 also shows an interface board 220 which has a plurality of pads 222. On this particular interface board 220, the pads are grouped into two types, namely source-trace pads 230 and sense-trace pads 232. The discussion at this time will not separate the two different types of pads on this particular interface board. The pads 222 provide an electrical path to the test electronics 112.

The anisotropic, compliant, conductive interposer material is comprised of an elastomeric sheet that includes a plurality of conductors. FIG. 3 shows a cross-sectional view of the particular anisotropic, compliant, conductive interposer material used in this invention. The particular anisotropic, compliant, conductive interposer material is a product named MT that is available from Shinetsu Polymer. Other types and brands of anisotropic, compliant, conductive interposer material could be used. The particular anisotropic, compliant, conductive interposer 204 has an elastomeric material 302 and a plurality of angled conductors 304. The angled conductors provide for reliable, resilient compression. The conductors 304 are in a high density matrix such that a large number of conductors connect each cantilevered spring contact to a corresponding contact pad, thereby keeping the contact resistance and inductance through the interposer 204 low. The elastomeric material is actually a silicone base that provides high compliance over a wide temperature range.

FIG. 4 shows a cross-sectional view of an assembled contactor attached to an interface board 220. The interface board 220 includes source pad 230 and sense pad 232, both of which can be referred to generally as pads 222. Within the interface board 220 are electrical conduction paths 400 and 402 which are connected to pad 230 and pad 232, respectively. As can be seen from FIG. 4, the anisotropic, compliant, conductive interposer material 204 is placed adjacent the pads 222. The contacts as attached to the stiffener 203 are placed adjacent the anisotropic, compliant, conductive interposer material 204. The anisotropic, compliant, conductive interposer material 204 is compressed between the pads 230 and 232 and the contacts 201 attached to the lead frame stiffener 203. The guide plate 108 is attached to the interface board. The guide plate 108 compresses the anisotropic conductive interface material 204, the contacts 201 and stiffener 203 which form the lead frame such that it supports the contacts and stiffener. In operation, a lead 212 from a device 210 contacts the contact 201 and an electrical path is formed between the particular lead and the test electronics 112. The electrical path to the particular lead 212 is comprised of the contact 201 paths through the conductors 304 in the anisotropic, compliant, conductive interposer material 204 and to pads 230 and 232. From the pads 230 and 232, there is an electrical path through the interface board 220. The electrical path 400 is for the pad 230 and the electrical path 402 is shown for pad 232. Electrical path 400 and electrical path 402 travel to the test electronics 112 (shown in FIG. 1). The guide plate 108 serves many purposes. Not only does the guide plate 108 apply a compression force to the interposer material contact 201 and stiffener 203, but also the guide plate guides and aligns the device 210 into the contact 201 and provides a surface for the hard stops 122 of the nest 106 to stop against.

It should be noted that the contact 201 has an upturned end 406. This is an advantage when making contact with a particular peripheral lead 212. The upturned end presents an edge 408 to the lead and as the lead 212 of the device 210 comes in contact with contact 201, the contact 201 bends or deflects downward and scrapes across the bottom of the lead 212. This provides for a scrubbing motion which assures a good electrical contact with the lead 212. In addition, the upturned end has an edge which is resistant to accumulation of solder. The contactor is typically cleaned on a periodic basis as part of maintenance to remove such scrapings.

Figure 5:
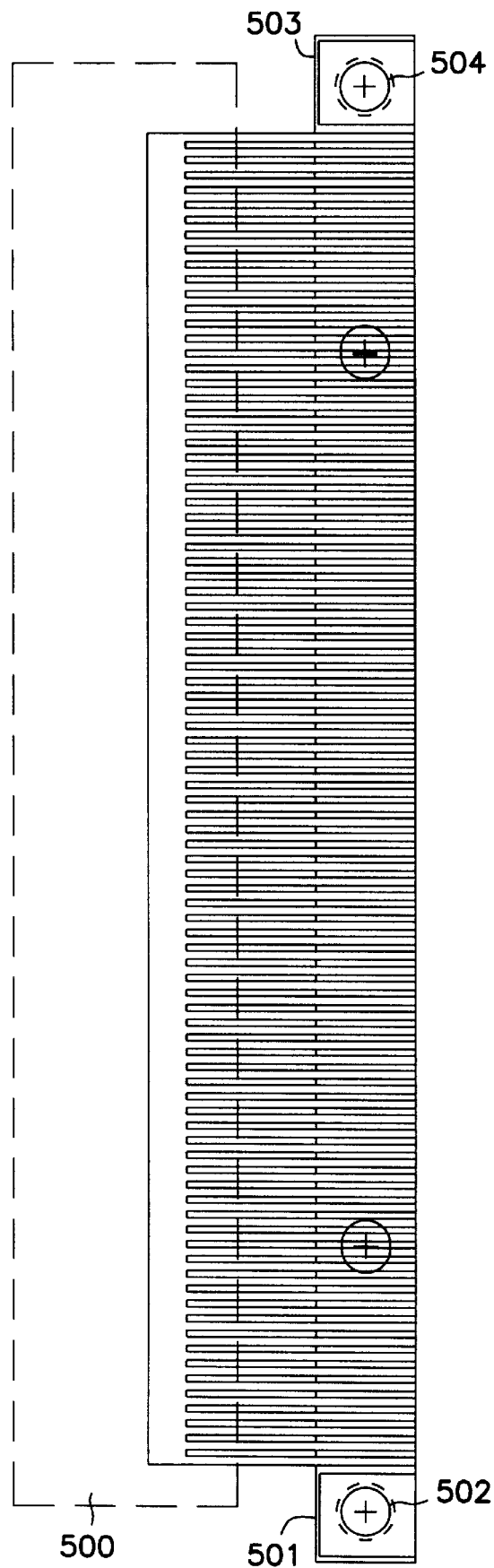
FIG. 5 is a top view of a lead frame with a plurality of cantilevered spring contacts or lead contacts attached with a stiffener.

Precise alignment is needed between the interface board, the contacts 201 and the guide plate 108 so that a particular desired lead 212 from the device 210 contacts a particular desired contact 201 of the contactor. FIG. 5 shows a series of contacts before they are in their final form. The series of contacts 201 are actually etched from a sheet of beryllium copper 500 material or other electrically conductive spring metal. The etching process also leaves a pair of end tabs 501 and 503. Openings are etched into a sheet of beryllium copper 500. The material remaining between the rectangular openings are the spring contact elements 201. Also etched into the sheet of beryllium copper 500 are two alignment holes 502 and 504. The alignment holes are etched into the end tabs 501 and 503. A stiffener 203 is attached to the contact spring elements 201 and to the two end tabs 501 and 503. The stiffener has openings which correspond to the openings in the end tabs. The precision associated with photomask etching is used to position the alignment hole with respect to the cantilevered spring contacts. Advantageously, the alignment holes 502 and 504 can be positioned to the tolerances associated with the etching process. After etching the individual contacts and the openings 502 and 504, the stiffener 203 is then attached to the contacts 201. The openings in the stiffener 203 are clearance openings that correspond to the openings 502 and 504. A piece of beryllium copper 500, shown in phantom in FIG. 5, is then removed so that the individual contacts are free and can act independently from one another. The guide plate 108 and the interface board 220 also have guide holes which correspond to the etched guide holes 502 and 504.

Alignment of the contacts with respect to the interface board 220 and the guide plate 108 is achieved by placing dowels 280 (shown in FIG. 2) into the holes 502 and 504 of the lead frame and the corresponding holes in the guide plate 108 and corresponding holes in the interface board 220. This allows for precision alignment of the guide plate 108, the interface board 220 and the individual cantilevered spring contacts 201.

Figure 6:
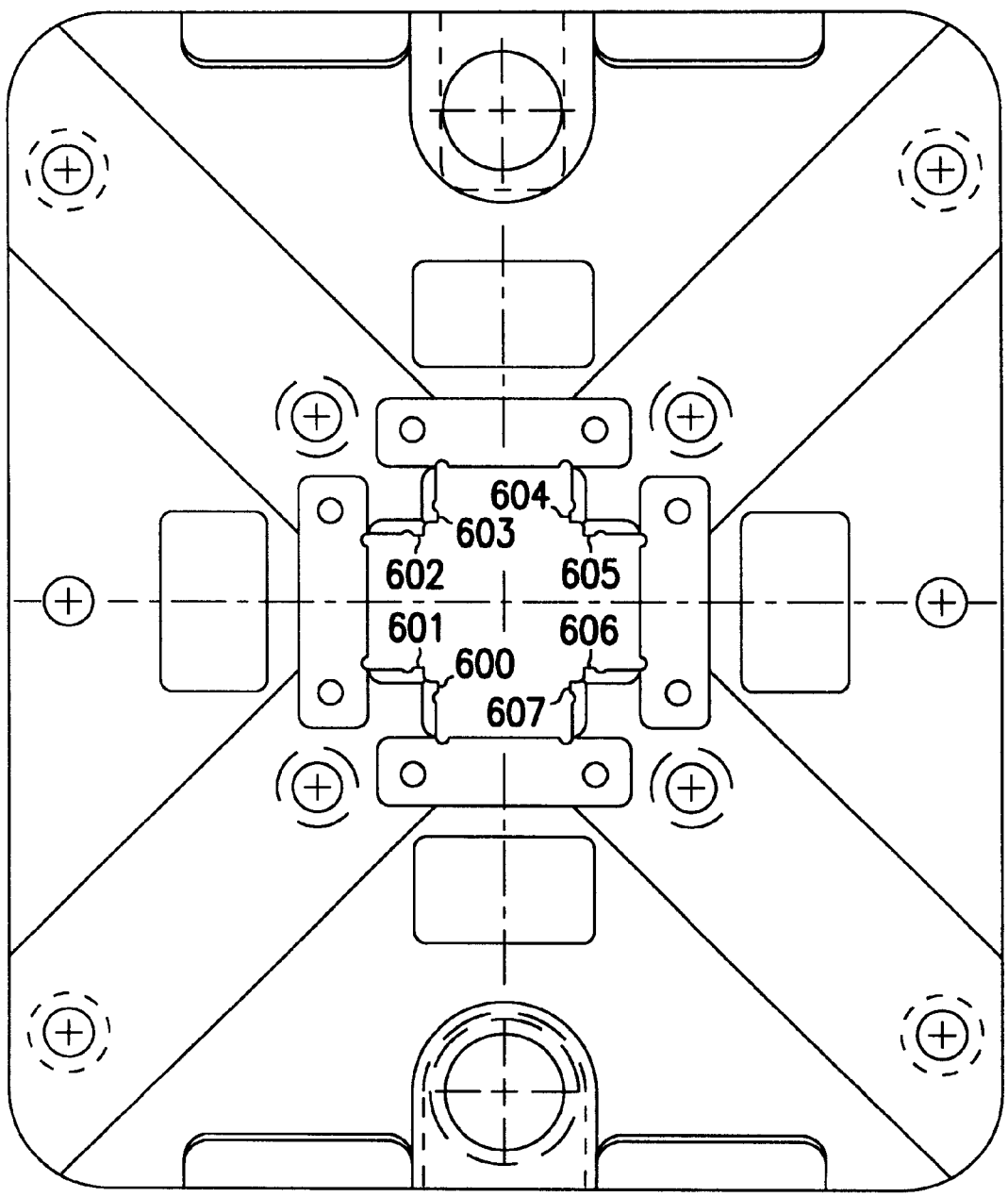
FIG. 6 is a top view of a contactor guide plate including datum for aligning the electrical component in the guide plate.

FIG. 6 shows a top view of the guide plate 108. The guide plate 108 includes several datum for aligning the device 210 and more specifically, the peripheral leads 212 of the device with respect to the guide plate 108. In this particular embodiment, eight datum are shown. The datum carry the reference numerals 600, 601, 602, 603, 604, 605, 606 and 607. Two datum are positioned near each corner of the device 210. Each reference datum is positioned so that it contacts one of the peripheral leads 212 at the corner of the device 210. Each datum directly contacts the side of a peripheral lead 212. It is contemplated that four alignment datum could be used at opposite corners of a device and would be adequate. However, two datum are provided on all four corners of the electrical component or device 210 since alignment surfaces are subject to wear. Using more reference datum, increases the total surface area of the various alignment features so that wear is reduced. In other words, eight wear surfaces wear longer than four wear surfaces.

Figure 10:
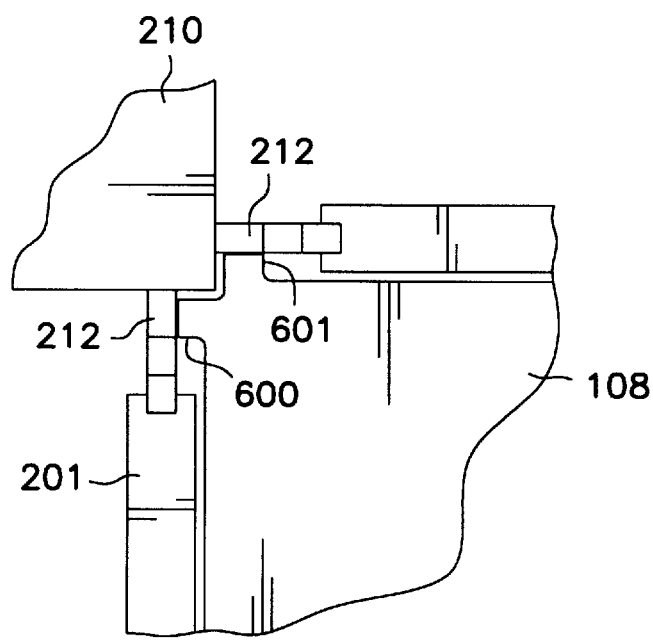
FIG. 10 is a top view of a corner of the device under test and a guide plate of the contactor shown in FIG. 6.

FIG. 10 shows a closeup of the corner of a device under test 210 and its peripheral leads 212. A portion of the guide plate 108 is shown close up. The cantilevered spring elements 201 are also shown. FIG. 10 shows that the cantilevered spring elements 201 are proportionally wider than the peripheral leads 212. The datum 600 and 601 extend away from the wall of the guide plate 108 and touch or contact the device leads 212 at a position near the device 210. The datum 600 and 601 contact the device leads at a position closest to the package body where the lead is strong and less likely to bend. The extension of the datum 600 and 601 from the inner wall of the grid plate provides centering of the device leads 212 on the cantilevered spring elements 201 to assure full contact tolerances.

Figure 7:
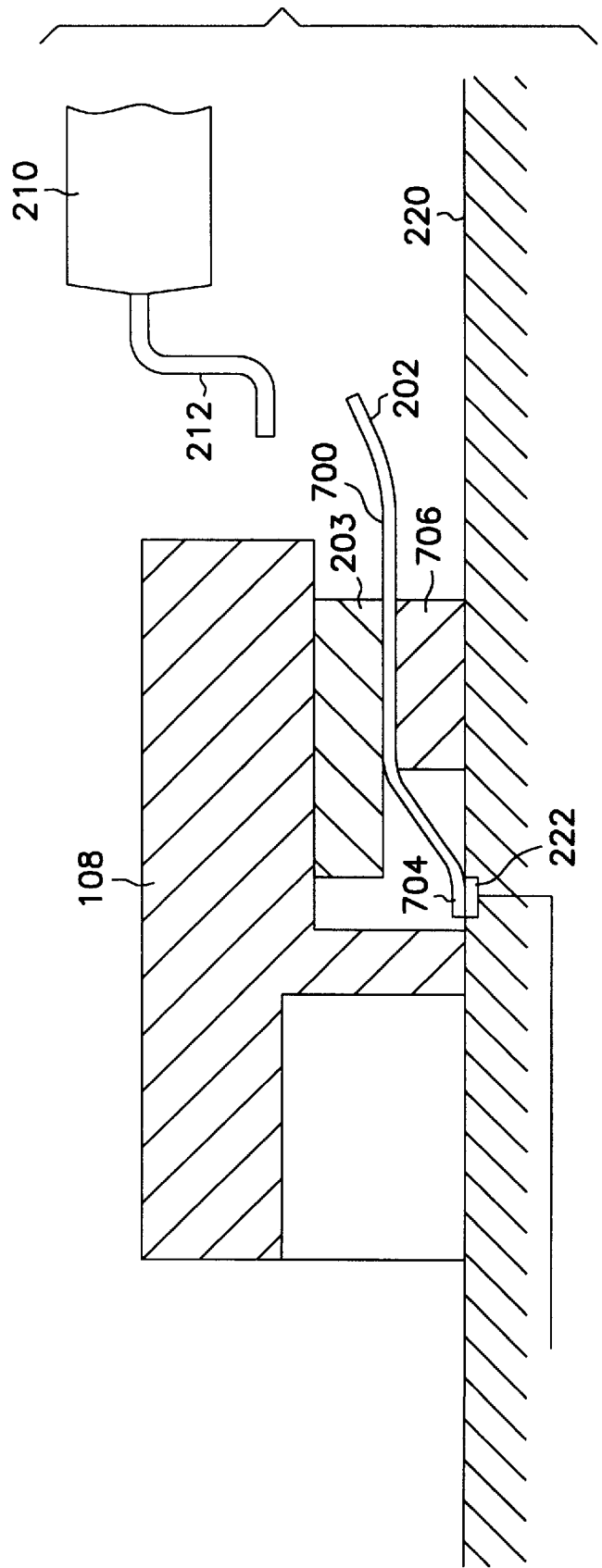
FIG. 7 is a cross section view of a contactor having a dual ended lead which directly contacts the interface board.

FIG. 7 shows another preferred embodiment of a contactor for a peripherally leaded device 210. The contact 700 in this device is different than the contact previously described. The contact 700 has two cantilevered or spring ends. The first spring end 702 is a free end which is upturned and which is positioned to contact the lead 212 of the device 210. The other end 704 of the contact or lead 700 directly contacts a pad 222 on the interface board 220. The pad 222 is in electrical communication with the test electronics 112. The other end 704 is another spring end. The spring end 704 places a force on the pad 222. A block 706 is attached to the guide plate through the stiffener 203. The block 706 and the stiffener 203 support the contacts when in an assembled position. The guide plate 108, stiffener 203 and interface board 220 are aligned using dowels placed through an etched hole associated with the contact 700. The guide plate 108 also receives the nest (not shown) and the device 210 and aligns them with the contacts 700 so that electrical contact can be made by a desired contact 700 with a desired peripheral lead 212 of the device 210.

Kelvin Connections

In testing some components, many times it is necessary to have a kelvin connection. A kelvin connection is a high-impedance sense connection that is used to measure a DC voltage at a particular point in an electrical path. There are several ways to accomplish or to make kelvin connections at, or close to, the leads 212 of the device under test. The first apparatus for making a kelvin connection has been shown in FIGS. 2 and 4. In FIGS. 2 and 4, a source connection and a kelvin sense connection are made at the cantilevered spring contact 201. The sense-trace pad 232 is connected to a high-impedance line into the test electronics 112. The source-trace pad 230 carries a signal or signals to and from the electrical component 210 via lead 212 and via contact 201. Thus, there are two electrical paths formed through the conductive interposer material 204. The DC voltage can be accurately measured through the high-impedance path attached to the sense trace 232. This provides a kelvin connection at the contact 201. At this point it should be noted that in FIGS. 2 and 4, it is not necessary to have a kelvin connection to the lead 212 of the device 210. If a kelvin connection is not required, the interface board 220 could just have a single pad that corresponds to a single contact 201.

Figure 8:
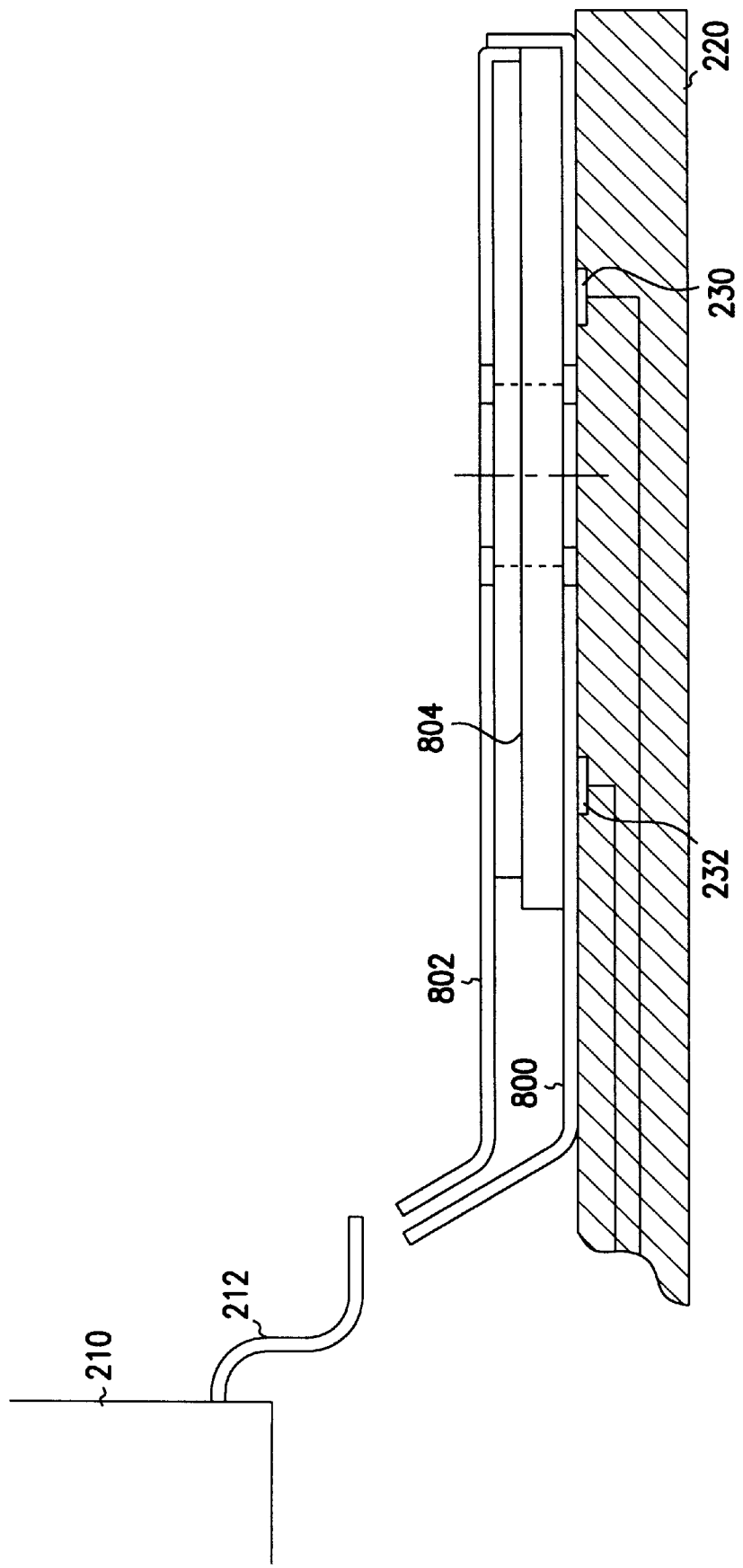
FIG. 8 is a cross sectional view of another contactor having a dual cantilevered spring contact for contacting a single peripheral lead.
Figure 9:
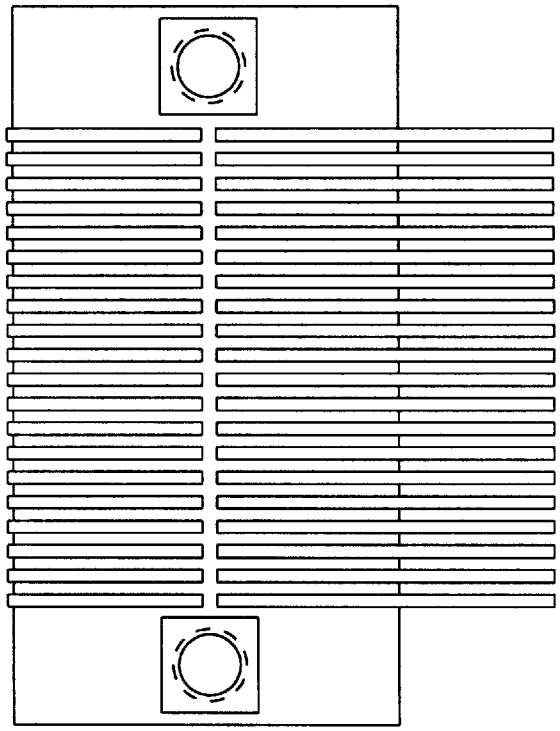
FIG. 9 is a bottom view of a lead frame from the contactor having a dual cantilevered spring contact for contacting a single peripheral lead.

Now turning to FIGS. 8 and 9, an apparatus for making a kelvin connection at the device lead is shown. FIG. 8 shows a pair of contacts 800 and 802 which will simultaneously contact one of the peripheral leads 212 of the device 210. One of the contacts 800 or 802 is a high-impedance path that is used to make a kelvin connection directly to the lead 212. The other of the contacts 800 or 802 carries a signal to or from the peripheral lead 212. A stiffener 804 is positioned between the two contacts 800 and 802. The resulting assembly includes a surface that contacts an interface board 220 which has a sense trace 232 and a source trace 230. The conductor 802 passes over the top of the stiffener 804, wraps around the stiffener and terminates so that it makes electrical contact with the source-trace pad 230 through the interposer. These are the ways of making kelvin connections within the contactor. Of course, there may be different ways to make kelvin connections with the device 210 which are within the scope of this invention.

The contactor for the peripherally leaded components or devices described has many advantages over prior contactors. The contacts such as 201 shown in FIGS. 2 and 4, as well as the contacts 700, shown in FIG. 7, and the contacts 800 and 802 shown in FIG. 8 are very short. The contacts 201 are approximately 0.1" long. The shortness of the contacts is an advantage in that they introduce very little parasitic capacitance and inductance to a signal passing through the short leads. Thus, there are very little undesirable impedance effects produced by the short leads which is highly advantageous in a test situation.

An additional advantage is that each individual contact such as 201 is a cantilever spring contact which can be compressed with very small forces. The primary concern for damage when a high contact force is used is excessive scrubbing of the plating on the peripheral leads. This plating damage alters the solderability of the peripheral leads. The peripheral leads of a device 210 are also fragile. If significant amounts of force are needed to make electrical contact, the peripheral leads can also be bent or otherwise damaged. Damage to the leads may make the component or device 210 unusable.

The preferred embodiments described also have an advantage in terms of compliance. Devices 210 are not planar or perfectly flat. Thus, a contactor must accommodate the non-planarity of the device and the leads attached to it. Each of the contacts such as 201, 700, 802 and 804 acts independently of the other contacts used to make an electrical path to the interface board and test electronics 112. The result is that cantilevered spring-type contacts allow maximum compliance to accommodate device non-coplanarities while still allowing for minimal contact compression force. In addition, the contactor makes reliable electrical connections through a wide range of temperature. The contacts are each merely a cantilevered spring contact of metal which are relatively unaffected by changes in temperature.

Another advantage is due to the construction of the contact leads 201 onto a stiffener 203. This not only forms a series of independent contacts which can accommodate coplanarities of the device under test but it also provides for a single element that can be easily and quickly replaced. As mentioned previously, these contactors are part of an automated production cell. The contacts undergo hundreds of thousands of cycles before they wear out. On an automated production cell when a contactor wears out, the guide plate 108 is removed and then the individual contact 201 and stiffener 203 assemblies are removed and replaced with new assemblies. Alignment is not a problem since the alignment holes have been etched into the new assembly so a contact replacement can take place in a matter of minutes compared to a number of hours required to replace the contacts in other contact devices. This is important when considering the high capital cost of a device 210 manufacturing line and the associated inefficiency cost due to down time of the line.

Adapter Assembly

Figure 11:
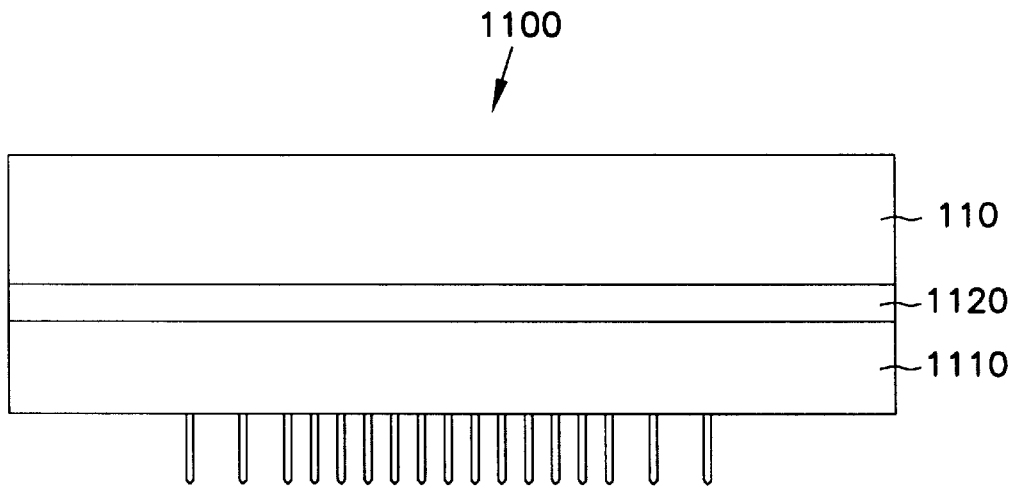
FIG. 11 is a side view of an adapter assembly for the contactor.

Also an advantage of this particular contactor is that an adapter can be made to allow the contactor to be used with interfaces originally designed for use with other contactors. FIG. 11 is a side view showing an adapter assembly 1100 with the contactor 110 on top. The adapter assembly 1100 includes a printed circuit board 1120, an adapter support block 1110, and adapter pins 1122. In this particular example, the adapter assembly 1100 adapts a solder-pin interface contactor to the contactor 110.

The adapter assembly 1100 translates the physical interface requirements of the contactor 110 to that of the contactor being replaced. Any adapter needs to have as its interface to the tester interface board, an interface identical to the contactor it is replacing. The adapter assembly 1100 shown, replaces a typical contactor which has rows of pins on the bottom which may be soldered to the interface board. The adapter assembly 1100, therefore, has on the bottom of the printed curcuit board 1120, the required rows of pins, soldered to the printed curcuit board 1120. The adapter support block 1100 provides strain relief for the pins 1122 and secures their alignment.

Figure 12:
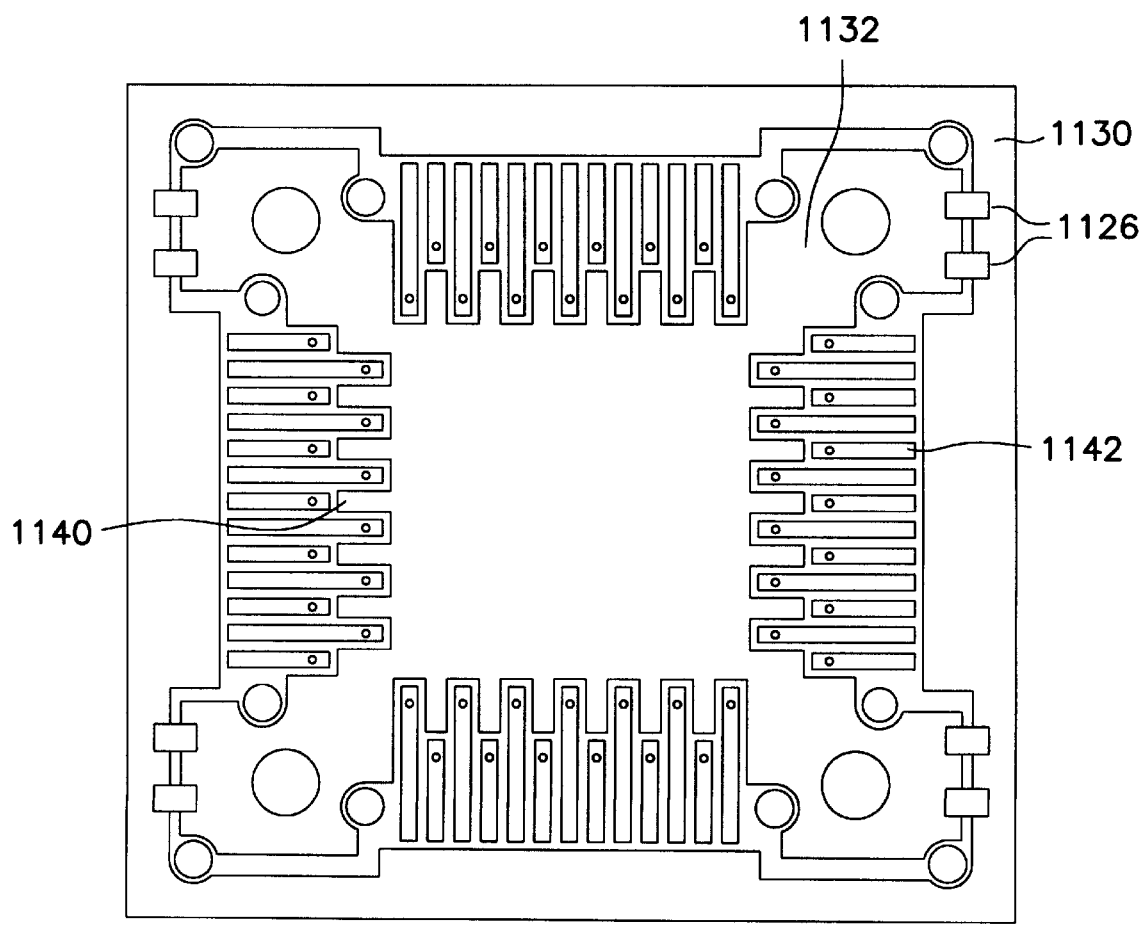
FIG. 12 is a top view of an adapter board of the adapter assembly.

Now looking both at FIG. 11 and at FIG. 12, the adapter board 1120 may also include external circuitry. The adapter shown includes a provision for connecting any of the pads on the adapter to one of two electrical planes. A very typical application in which external circuitry is used is when the power and ground of the device under test require decoupling capacitors to be connected as close to the device as possible. Decoupling capacitors 1126 are shown on the adapter board 1120, connected between a power plane 1130 and a ground plane 1132. Pads corresponding to the device ground and power pins are connected to ground and power planes, respectively.

Two such lead connections are shown. A ground plane lead connection 1140 and a power plane lead connection 1142 are shown.

The adapter assembly 1100 shown fits within the opening of a prior contactor. The contactor 110 fits atop the adapter board 1120. The adapter board 1120 includes come circuitry previously considered external to the contactor. The external circuitry shown are decoupling capacitors 1126.

Manual Actuator

Figure 13:
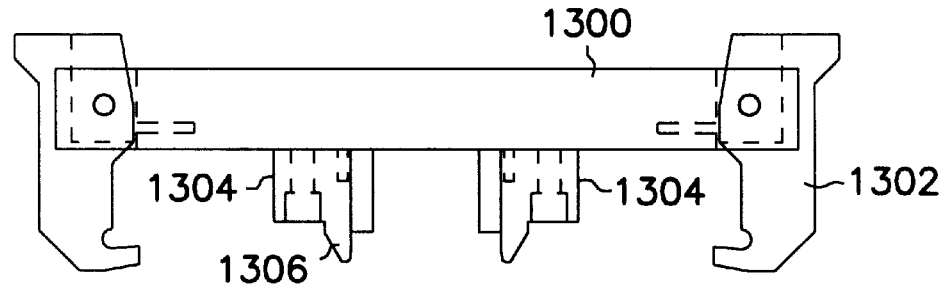
FIG. 13 is a front view of a manual actuator.
Figure 14:
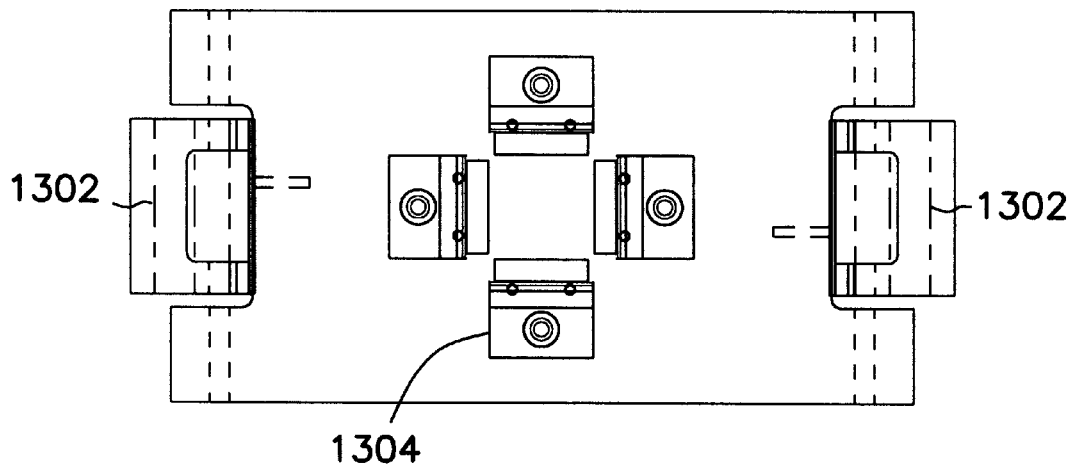
FIG. 14 is a bottom view of a manual actuator.
Figure 15:
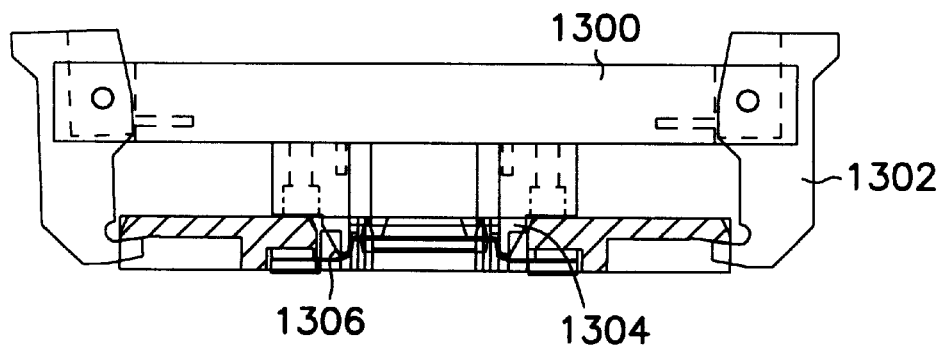
FIG. 15 is a side view of a manual actuator clipped onto a contactor.

FIGS. 13–15 are views of a manual actuator for a peripherally leaded component. The manual actuator includes a frame 1300, spring clips 1302 and work press rails 1304. The work press rails 1304 include a beveled portion 1306 which act as an alignment feature. The work press rails 1304 press the leads of the peripherally leaded component into contact with the cantilevered spring contacts of the contactor 110. The work press rails 1304 are approximately the same size as the area of the leads. The spring clips 1302 grip the outside edges of the guide plate 108 as shown in FIG. 15.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus for receiving an electrical component having peripheral leads and making electrical connections with the peripheral leads comprising:

a plurality of electrically conductive cantilever spring contacts for contacting the peripheral leads on the component having peripheral leads, each cantilever spring contact having a first free end, and a second attached end;

an anisotropic conductive compliant interposer positioned adjacent to and in electrical contact with the second attached end of each of the cantilever spring contacts;

an alignment mechanism for aligning the peripheral leads of the component with the corresponding cantilever spring contacts; and an interface board in contact with the anisotropic conductive interposer, said anisotropic conductive interposer making electrical contact with pads on the interface board wherein said interface board has pads positioned so that at least two pads on said interface board make electrical contact through said anisotropic conductive interposer when a single cantilever spring contact contacts the peripheral leads of the electrical component.

2. The apparatus for receiving an electrical component having peripheral leads of claim 1 further comprising electrical test equipment in electrical communication with said interface board.

3. The apparatus for receiving an electrical component having peripheral leads of claim 1 wherein one of said at least two pads on said interface board is a high impedance electrical path.

4. The apparatus for receiving an electrical component having peripheral leads of claim 1 wherein two cantilever spring contacts are positioned to contact a single peripheral lead of said electrical component.

5. The apparatus for receiving an electrical component having peripheral leads of claim 4 wherein one of said leads contacting a single peripheral lead is a portion of a high impedance electrical path.

6. The apparatus for receiving an electrical component having peripheral leads of claim 1, wherein the alignment mechanism further comprises a nonconductive datum surface which contacts a peripheral lead of said electrical component.

7. The apparatus for receiving an electrical component having peripheral leads of claim 1 wherein the alignment mechanism further comprises a plurality of nonconductive datum surfaces which contact a peripheral lead of said electrical component.

8. The apparatus for receiving an electrical component having peripheral leads of claim 1 wherein the alignment mechanism further comprises a nonconductive datum surface which contacts a peripheral lead near the body of said electrical component.

9. The apparatus for receiving an electrical component having peripheral leads of claim 1 wherein the cantilever spring contacts are made of a material capable of withstanding a high number of operating cycles.

10. The apparatus for receiving an electrical component having peripheral leads of claim 9 wherein the cantilever spring contacts are made of beryllium copper.

11. The apparatus for receiving an electrical component having peripheral leads of claim 9 wherein the cantilever spring contacts are made of a noble metal.

12. Apparatus for receiving an electrical component having peripheral leads and making electrical connections with the peripheral leads comprising:

a plurality of electrically conductive cantilever spring contacts for contacting the peripheral leads on the component having peripheral leads, each cantilever spring contact having a first free end, and a second attached end;

an anisotropic conductive compliant interposer positioned adjacent to and in electrical contact with the second attached end of each of the cantilever spring contacts; and an alignment mechanism for aligning the peripheral leads of the component with the corresponding cantilever spring contacts wherein the alignment mechanism further comprises:

a guide plate having an opening therein;
a nonconductive lead frame having an opening therein;
an interface board having an opening therein; and
an alignment pin which extends through the opening in the guide plate, the opening in the nonconductive lead frame, and the opening in the interface board.

13. The apparatus for receiving an electrical component having peripheral leads of claim 12 wherein said plurality of cantilever spring contacts are attached to said nonconductive lead frame, said plurality of cantilever spring contacts formed by an etching process, said etching process also including forming an etched alignment opening, said alignment pin also passing through the etched alignment opening.

14. The apparatus for receiving an electrical component having peripheral leads of claim 12, wherein the apparatus is coupled with an adapter asssembly, the adapter assembly comprising a printed circuit board having electrical conductors, and adapter pins in electrical contact with circuit board electrical conductors, wherein the cantilever spring contact's second end is in electrical contact with the circuit board conductors, whereby the apparatus may be used with different testers by inserting an adapter assembly between the tester and the contactor.

15. The apparatus for receiving an electrical component having peripheral leads of claim 14 wherein said adapter assembly further comprises a plurality of electrical planes.

16. The apparatus for receiving an electrical component having peripheral leads of claim 14 wherein said adapter assembly further comprises electrical circuitry and components.

\* \* \* \* \*